United States Patent [19]

Wu

[11] Patent Number: 6,117,711

[45] Date of Patent: Sep. 12, 2000

[54] METHOD OF MAKING SINGLE-ELECTRON-TUNNELING CMOS TRANSISTORS

[75] Inventor: Shye-Lin Wu, Hsinchu, Taiwan

[73] Assignee: Texas Instruments - Acer Incorporated, Hsinchu, Taiwan

[21] Appl. No.: 09/033,560

[22] Filed: Mar. 2, 1998

[51] Int. Cl.[7] ...................... H01L 21/8238; H01L 21/762
[52] U.S. Cl. ........................ 438/154; 438/164; 438/440
[58] Field of Search .................... 438/199, 218, 438/412, 465, 440, 370, 423, 526, 410, 404, 425, 407, 162, 154, 155, 164, 264, 257, 450; 257/458

[56] References Cited

U.S. PATENT DOCUMENTS

| | | | |
|---|---|---|---|
| 5,593,813 | 1/1997 | Kim | 430/312 |
| 5,658,809 | 8/1997 | Nakashima et al. | 438/766 |
| 5,877,048 | 3/1999 | Wu | 438/199 |
| 5,886,380 | 3/1999 | Nakajima | 257/321 |
| 5,923,981 | 7/1999 | Qian | 438/284 |
| 6,010,934 | 1/2000 | Wu | 438/264 |

*Primary Examiner*—Mary Wilczewski
*Assistant Examiner*—David Goodwin
*Attorney, Agent, or Firm*—Harness, Dickey & Pierce, P.L.C.

[57] ABSTRACT

The present invention includes forming field oxide (FOX) isolations on a substrate. A pad oxide layer is then formed on the substrate. An ion implantation is carried out to dope dopants into the substrate by using FOX as a hard mask. Thus, a buried oxygen amorphized region is formed in the substrate. Subsequently, a high temperature thermal anneal is performed to convert the oxygen amorphized region into an buried oxide layer, thereby forming localized Si islands between the substrate and the buried oxide layer. A further thermal oxidation is used to narrow the thickness of the localized Si islands, thereby forming nanometer Si wires. Then, a further ultra thin gate oxide layer is regrow on the nanometer Si wires. Then, CMOS transistors are formed on the substrate.

24 Claims, 2 Drawing Sheets

METHOD OF MAKING SINGLE-ELECTRON-TUNNELING CMOS TRANSISTORS

The present invention relates to a semiconductor device, and more specifically, to a method of fabricating a single-electron-tunneling transistor.

BACKGROUND OF THE INVENTION

The semiconductor industry has been advanced to the field of Ultra Large Scale Integrated (ULSI) technologies. The fabrication of the metal-oxide-semiconductor transistor also follows the trend. As the size of the devices is scaled down, silicon based nanoscale electronics have been attention for these years. For example, single-electron-tunneling devices are developed in recent years. The single-electron-tunneling devices are referred to SET devices herein. As known in the art, the single-electron-tunneling devices are formed by using silicon nanocrystals and operated by so called Coulomb blockade effect. Typically, the single-electron-tunneling devices have a narrow crystalline Si channel and a nanoscal floating gate.

The Coulomb blockade effect relates to one-by-one electron manipulation, which is the basic element to operate the single-electron-tunneling devices. Since the single-electron-tunneling devices exhibit potential quantized threshold voltage shift, thus it is one of the reasons that is attracted by the researcher. In the other words, the charge of a single electron to the floating gate will lead to quantized threshold shift and discrete charging voltage. In addition, the single-electron-tunneling devices are also a very promising phenomenon for being used in extremely low power devices in the future. In order to develop the devices for commercial application, room temperature operation capabilities are necessary. Another key point of the devices is based on the Si construct. Y. Takashashi, et al. proposed a single electron transistor having conductance oscillation at room temperature. This can refer to "Conductance Oscillation of a Si Single Transistor at Room Temperature", in IEDM, Tech. Dig., p. 938, 1994. Takashashi proposed a SET device with capacitance about 2aF. Under the small capacitance, the devices exhibit conductance oscillation at room temperature. Critical steps of this method are to form a superficial silicon layer of a SIMOX (separation by implanted oxygen) wafer and perform a thermal oxidation. The oxidation occurs at the interface between the silicon and buried silicon dioxide. The oxidation occurs more in the neighborhood of the pattern edge. Therefore, the constricted regions are formed at the ends of the wire. Another prior art proposed by Nakajima disclosed the single-electron memory having an ultra-small self-aligned floating dot gate. Please see "Room Temperature Operation of Single-Electron Memory with Self-Aligned Floating Dot Gate", in IEDM Tech. Dig., p. 952, 1996.

Another article that relates to the topic is proposed by Lingjie Guo, "Si Single-Electron MOS Memory With Nanoscale Floating-Gate and Narrow Channel", in IEDM Tech. Dig., p. 955, 1996. In the article, the devices have two major features. The first one is that the width of the Si MOSFET channel is narrower than the Debye screening length of single electron, and another one is the floating gate that is in nanoscale dimension. Further, Dutta disclosed a method to make silicon nanocrystals by controlling the nucleation and growth of silicon particles in $SiH_4$ plasma. In the prior art, the devices show Coulomb blockade and Coulomb staircase at room temperature. Specifically, the nanocrystals are formed in a very-high-frequency (VHF) plasma cell fed with $SiH_4$ and $H_2$ gases. Please see "Fabrication, and Electrical Characteristic of Single Electron Tunneling Devices Based on Si Quantum Dots Prepared by Plasma Processing", A. Dutta, et al., Jap. J. Appel. Phys., vol. 36, p. 4038, 1997. Although much effort has been made to realize silicon-based SET devices, their smallest dimensions required for SET operation depend on non-artificial processes, such as grain control and inhomogeneous oxidation that can hardly be determined in the design stage.

SUMMARY OF THE INVENTION

In the method, a plurality of isolations are formed on a substrate. A pad oxide layer consisted of silicon oxide is then formed on the substrate. An ion implantation having high energy and high dose is carried out to dope oxygen ions into the substrate by using the isolations as a hard mask. Thus, a buried oxygen amorphized region is formed in the substrate and keeps a distance from the surface of the substrate. Subsequently, a high temperature thermal anneal is performed to convert the oxygen amorphized region into an buried oxide layer, thereby forming localized Si islands between the substrate and the buried oxide layer. A further thermal oxidation is used in ambient containing oxygen to scale down the thickness of the localized Si islands, thereby forming nanometer Si wires. The following step is to remove the thick oxide. Then, a further ultra thin gate oxide layer is regrow on the nanometer Si wires. Then, CMOS transistors are formed on the Si wires by using conventional way.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel simple method to fabricate silicon-based CMOS single-electron-tunneling transistors. In the method, high energy and high dose oxygen ion implantation is introduced. High temperature anneal is used to form a buried oxide. An oxidation is used to scale down the thickness of the Si layer on buried oxide. Further, the proposed devices could be realized and the processes for making the SET devices are controllable and manufacturable. The detail description will be seen as follows.

Figure 1:
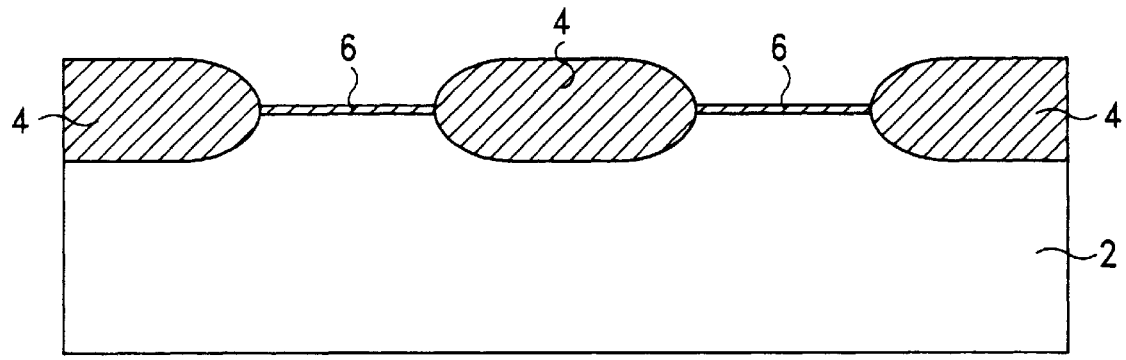
FIG. 1 is a cross sectional view of a semiconductor wafer illustrating the steps of forming field oxide regions and a pad oxide on a semiconductor substrate according to the present invention.

In a preferred embodiment, as shown in the FIG. 1, semiconductor substrate, such as a single crystal silicon substrate 2 with a <100> crystallographic orientation is provided. A plurality of isolations 4 between devices are formed on the substrate 2. In general, field oxide (FOX) isolation or trench isolation techniques can be introduced to serve as the isolations 4. For example, the FOX isolations 4 can be formed via lithography and etching steps to etch a silicon nitride and silicon dioxide composition layer. After the photoresist is removed and wet cleaned, thermal oxidation in steam environment is used to grow the FOX isolations 4 in the area uncovered by the composition mask. A pad oxide layer 6 consisted of silicon oxide is then formed on the substrate 2. Typically, the pad oxide 6 can be grown in oxygen ambient in a furnace at a temperature of about 800 to 1100 degrees centigrade. Alternatively, the pad oxide layer 6 can be formed by chemical vapor deposition.

Figure 2:
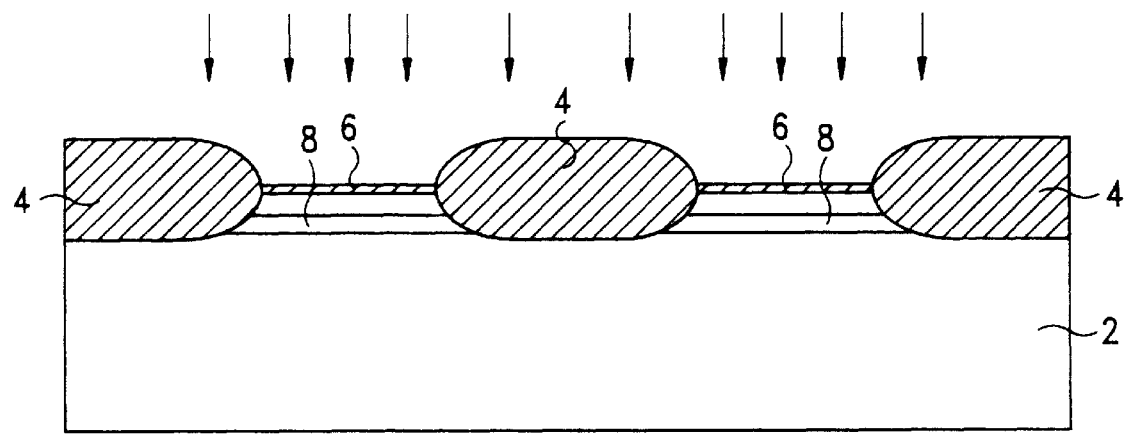
FIG. 2 is a cross sectional view of a semiconductor wafer illustrating the step of performing an ion implantation according to the present invention.

Please turning to FIG. 2, an ion implantation having high energy and high dose is carried out to dope dopants into the substrate 2 by using FOX isolations 4 as a hard mask. In this step, a buried oxygen amorphized region 8 is formed in the substrate and keeps a distance from the surface of the substrate 2. For example, oxygen ions may be used as the dopants for the implantation. The dose of the ion implantation is about 5E16 to 1E19 atoms/cm$^2$, and an energy of the implantation is about 100 to 1000 KeV. It should be well understood by those skill in the art that any suitable dopants could be used by simply substituting dopants to those given for the aforesaid step.

Figure 3:
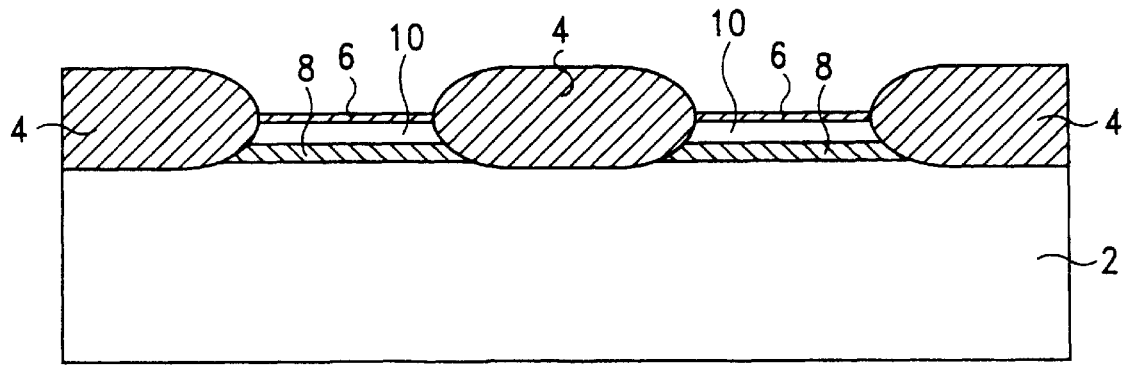
FIG. 3 is a cross sectional view of a semiconductor wafer illustrating the step of forming localized Si islands by a thermal oxidation according to the present invention.

Referring to FIG. 3, subsequently, a high temperature thermal anneal is performed to convert the oxygen amorphized region 8 into an buried oxide layer 8, thereby forming localized Si islands 10 between the substrate 2 and the buried oxide layer 8. In the step, $N_2O$ or $N_2/O_2$ ambient is introduced for the thermal anneal. The temperature for forming the localized Si islands 10 ranges from 1050 to 1350 degrees centigrade. The thickness is typically controlled by the time and the temperature of the oxidation.

Figure 4:
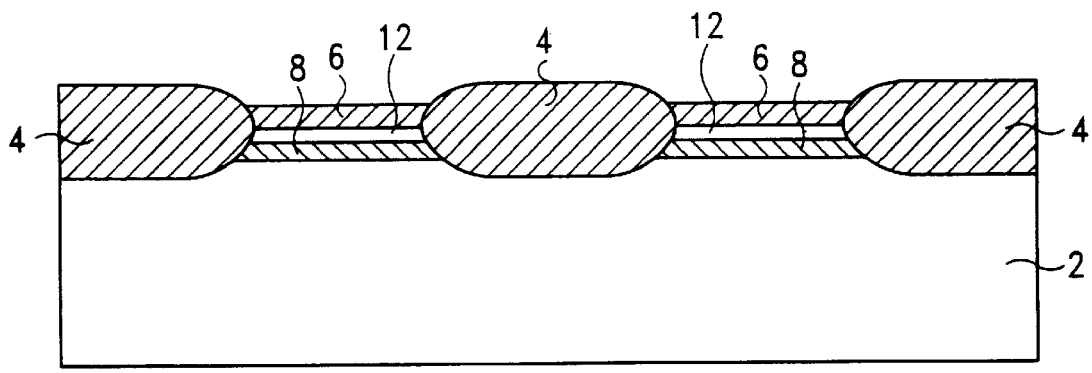
FIG. 4 is a cross sectional view of a semiconductor wafer illustrating the step of forming Si wires by a further thermal oxidation according to the present invention.

Turning to FIG. 4, a further thermal oxidation is used in ambient containing oxygen at a temperature of about 750 to 1150 degrees centigrade. Thus, the thickness of the pad oxide 6 is increased by the oxidation. The oxygen penetrates through the oxide 6 into the substrate 2 and the oxidation occurs therein. The oxide 6 expands into the substrate 2, thereby narrowing the thickness of the localized Si islands 10. To control the thickness of the oxide 6 can control the size of the Si wires 12. Therefore, the localized Si islands 10 become Si wires 12 having the nanometer scale by controlling the factors of the oxidation, such as the time and the temperature of the oxidation. Alternatively, the pad oxide 6 may be removed first, then the oxidation is used to regrow the oxide 6.

Figure 5:
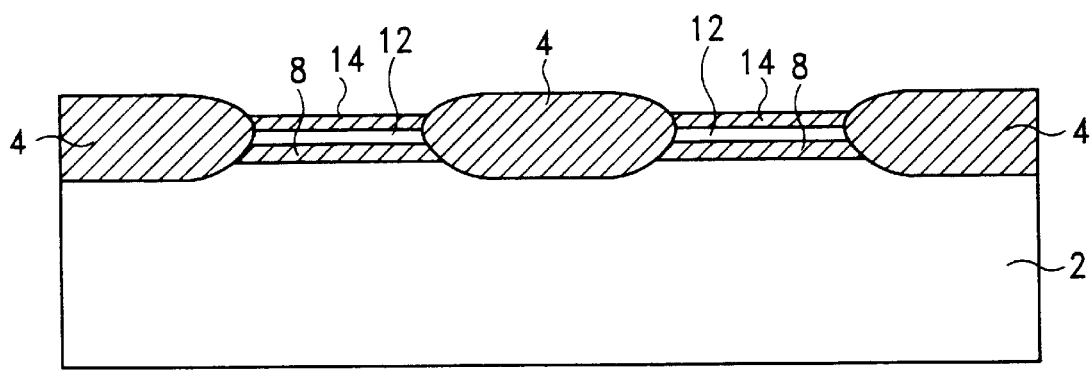
FIG. 5 is a cross sectional view of a semiconductor wafer illustrating the step of forming an ultra thin gate oxide according to the present invention.

Turning to FIG. 5, the following step is to remove the thick oxide 6, the FOX isolations 4 remain over the substrate 2. In the embodiment, the oxide 6 can be removed by using BOE (buffer oxide etching) solution or diluted HF solution. Then, a further ultra thin gate oxide layer 14 is regrown on the nanometer Si wires 12.

Figure 6:
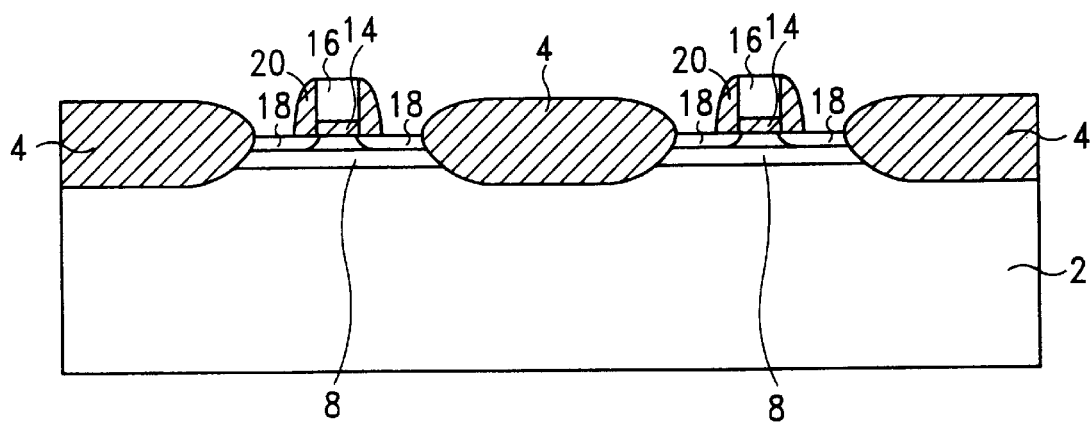
FIG. 6 is a cross sectional view of a semiconductor wafer illustrating the step of forming CMOS transistors according to the present invention.

As can be seen in the FIG. 6, the CMOS transistors are fabricate by standard processes on the substrate 2. This can be achieved by following steps. First, a polysilicon layer 16 is formed on the gate oxide 14. Then, the gate structures are formed on the substrate 2 by patterning the polysilicon layer and gate oxide 14 by conventional manner. The source and drain 18 are formed adjacent to the gate structure under an ion implantation. Further, the side wall spacers 20 are formed on the side walls of the gate structures. As known in the skill of the art, the PMOSFET and NMOSFET can be formed respectively. However, it is not the feature of the present invention, thus only a brief description is given. Finally, the CMOS transistors are formed on the nanometer Si wires. The thickness of the Si wires is preferably about 30 to 300 angstroms.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing single-electron-tunneling CMOS transistors on a semiconductor substrate, said method comprising the steps of:

forming a plurality of isolations on said semiconductor substrate;

forming a pad oxide on said semiconductor substrate;

performing an ion implantation to dope dopants into said semiconductor substrate using said plurality of isolations as a mask, thereby forming an oxygen amorphized region in said semiconductor substrate, said oxygen amorphized region keeping a distance from a surface of said oxygen amorphized region;

performing a thermal anneal to convert said oxygen amorphized region into a buried oxide, thereby forming localized silicon islands between said pad oxide and said buried oxide;

performing a thermal oxidation to increase a thickness of said pad oxide and narrow a thickness of said localized silicon islands, thereby forming silicon wires between said pad oxide and said buried oxide;

removing said pad oxide; and forming said single-electron-tunneling CMOS transistors on said silicon wires.

2. The method of claim 1, wherein said pad oxide comprises silicon oxide.

3. The method of claim 1, wherein the dopants for said ion implantation are oxygen ions.

4. The method of claim 1, wherein the dosage of said ion implantation is about 5E16 to 1E19 atoms/cm$^2$.

5. The method of claim 1, wherein the energy of said ion implantation is about 100 to 1000 KeV.

6. The method of claim 1, wherein said thermal anneal is performed in $N_2O$ ambient.

7. The method of claim 1, wherein said thermal anneal is performed in $N_2/O_2$ ambient.

8. The method of claim 1, wherein said thermal anneal is performed at a temperature about 1050 to 1350 degrees centigrade.

9. The method of claim 1, wherein said thermal oxidation is performed in $O_2$ ambient.

10. The method of claim 1, wherein said thermal oxidation is performed at a temperature about 1050 to 1350 degrees centigrade.

11. The method of claim 1, wherein the thickness of said silicon wires is in nanometer scale.

12. The method of claim 1, wherein said pad oxide layer is removed by using buffer oxide etching (BOE) solution.

13. The method of claim 1, wherein said pad oxide layer is removed by using diluted HF solution.

14. A method for manufacturing silicon wires in a semiconductor substrate, said method comprising the steps of:

forming a plurality of isolations on said semiconductor substrate;

forming a pad oxide on said semiconductor substrate;

performing an ion implantation to dope dopants into said semiconductor substrate using said plurality of isolations as a mask, thereby forming an oxygen amorphized region in said semiconductor substrate, said oxygen amorphized region keeping a distance from a surface of said oxygen amorphized region;

performing a thermal anneal to convert said oxygen amorphized region into a buried oxide, thereby forming localized silicon islands between said pad oxide and said buried oxide; and performing a thermal oxidation to increase a thickness of said pad oxide and narrow a thickness of said localized silicon islands, thereby forming said silicon wires between said pad oxide and said buried oxide.

15. The method of claim 14, wherein said pad oxide comprises silicon oxide.

16. The method of claim 14, wherein the dopants for said ion implantation are oxygen ions.

17. The method of claim 14, wherein the dosage of said ion implantation is about 5E16 to 1E19 atoms/cm$^2$.

18. The method of claim 14, wherein the energy of on implantation is about 100 to 1000 KeV.

19. The method of claim 14, wherein said thermal annual is performed in $N_2O$ ambient.

20. The method of claim 14, wherein said thermal annual is performed in $N_2/O_2$ ambient.

21. The method of claim 14, wherein said thermal annual is performed at a temperature about 1050 to 1350 degrees centigrade.

22. The method of claim 14, wherein said thermal oxidation is performed in $O_2$ ambient.

23. The method of claim 14, wherein said thermal oxidation is performed at a temperature about 750 to 1050 degrees centigrade.

24. The method of claim 14, wherein the thickness of said silicon wires is in nanometer scale.

* * * * *